United States Patent [19]

Myer

[11] Patent Number: 4,873,492
[45] Date of Patent: Oct. 10, 1989

[54] AMPLIFIER WITH MODULATED RESISTOR GAIN CONTROL

[75] Inventor: Robert E. Myer, Denville, N.J.

[73] Assignee: American Telephone and Telegraph Company, AT&T Bell Laboratories, Murray Hill, N.J.

[21] Appl. No.: 280,076

[22] Filed: Dec. 5, 1988

[51] Int. Cl.$^4$ .............................................. H03G 3/20
[52] U.S. Cl. ........................................ 330/86; 330/84; 330/137; 330/282
[58] Field of Search ............. 330/84, 86, 52, 137, 330/144, 145, 282, 283, 284; 332/23

[56] References Cited

U.S. PATENT DOCUMENTS

| | | | |
|---|---|---|---|
| 4,379,272 | 4/1983 | Wheatley | 330/144 X |
| 4,441,082 | 4/1984 | Haque | 330/129 |
| 4,731,590 | 3/1988 | Saari | 330/278 |

*Primary Examiner*—James B. Mullins
*Attorney, Agent, or Firm*—Jack S. Cubert

[57] ABSTRACT

An automatic gain control circuit for an amplifier operating over a prescribed frequency range detects the output level of the amplifier; and couples a repeated predetermined waveform occurring at a rate greater than the reciprocal of twice the upper frequency of the prescribed frequency range to the output level signal. The waveform varying level signal is compared to a reference threshold to control the gain of the amplifier through a switched resistive elemement in the amplifier feedback path. The repeated waveform variations about the amplifier output level causes the value of the switched resistance to vary as a function of the output level. A low pass filter connected to the amplifier output removes switching transients resulting from the high frequency changes in the switched resistive element. The gains of a plurality of amplifiers may be determined by a common control for accurate tracking over a wide dynamic range.

27 Claims, 6 Drawing Sheets

1

AMPLIFIER WITH MODULATED RESISTOR GAIN CONTROL

FIELD OF THE INVENTION

The invention relates to amplifiers having automatic gain control and more particularly to automatic gain control arrangements using switched control elements.

BACKGROUND OF THE INVENTION

Automatic gain control arrangements are used in amplifiers where it is desired to have a relatively constant output level for a wide range of input signals. As is well known in the art, such control is obtained by using negative feedback with variable elements so that the amplifier gain is a function of the values of the variable elements which values are controlled by the amplifier output level. If the output level is higher than desired, the variable element value in the feedback path is changed to reduce the amplifier gain. When the output level is lower than desired, the variable element value is modified to increase the amplifier gain. In this way, the amplifier output is held within a prescribed range over a much larger range of input signals.

Both resistive and capacitive elements have been used to obtain variable gain. Generally, resistive variations are obtained using a switched resistor or capacitor network in which the resistance or capacitance value is controlled by switching under digital control. U.S. Pat. No. 4,441,082 issued to Yusuf A. Haque, Apr. 3, 1984, for example, discloses a switched capacitor automatic gain control loop utilizing a capacitor array switched to vary the gain of an amplifier by an up-down counter responsive to the amplifier output level. The switching arrangement, however, may cause delay in the gain adjustment and noise effects. Elimination of such delay and noise can result in unduly complex circuitry.

A simpler arrangement employs a variable resistance semiconductor device such as a MOSFET controlled by the amplifier output level. In systems where there is more than one gain controlled amplifier and the gain control characteristics of the amplifiers must be coordinated, it is difficult to match the characteristics of the semiconductor resistance devices of the different amplifiers. U.S. Pat. No. 4,731,590 issued to Veikko R. Saari, Mar. 15, 1988, discloses a plurality of MOSFET variable resistance devices in a single signal control loop to provide gain control for a plurality of amplifier circuits. The automatic gain control curve and the dynamic range that can be accommodated, however, are limited by the characteristics of the MOSFET devices. It is an object of the invention to provide an improved gain control circuit adapted to coordinate the gain control of one or more amplifiers with selectable gain control characteristics over a large dynamic range.

BRIEF SUMMARY OF THE INVENTION

The foregoing object is achieved by the switching of resistive control elements in the gain control loop at a rate at least twice the highest frequency of interest as a function of amplifier output level to obtain a selected variable gain characteristic and low pass filtering the amplifier output to remove high frequency switching transients.

The invention is directed to a circuit for controlling the gain of an amplifier having a prescribed frequency range in which a switched resistive element controls the amplifier gain. A first signal representative of the output level of the amplifier is formed. A second signal having a predetermined waveform repeated at a rate exceeding the reciprocal of twice the upper frequency of the prescribed frequency range is generated and combined with the level representative signal to produce a third signal having a level corresponding to the first signal and varying therefrom according to the second signal. The third signal is compared to a reference threshold to modify the value of the switched resistive element responsive to the difference between the third signal and the reference threshold.

According to one aspect of the invention, the frequency range of the amplifier output is limited to remove the transient effects of the resistive element switching.

DETAILED DESCRIPTION

Figure 1:
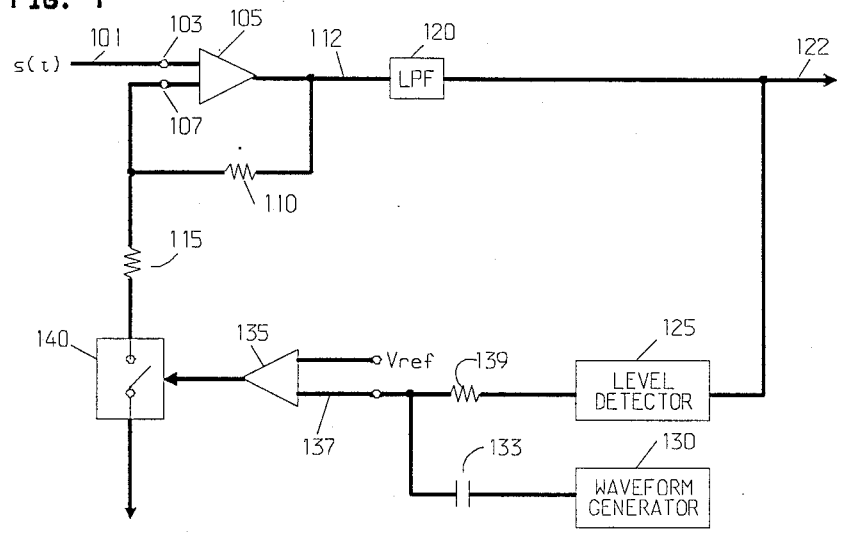
FIG. 1 depicts a general block diagram of an automatic gain control circuit for a single amplifier that is illustrative of the invention.

FIG. 1 depicts an amplifier circuit employing an automatic gain control arrangement illustrative of the invention. In FIG., 1, a baseband input signal s(t) such as an audio, video or other information bearing signal having an upper frequency limit $f_u$ is applied to input 103 of operational type amplifier 105 via lead 101. Resistor 110 connected between the amplifier output and amplifier input 107 and resistor 115 connected between amplifier input 107 and ground via switch 140 determine the gain of the amplifier stage as is well known in the art. The signal appearing at amplifier output 112

$$(R_1+R_2)/R_2\ s(t)$$

is passed through low pass filter 120 which has a cutoff frequency at least twice $f_u$. $R_1$ is the value of resistor 110 and $R_2$ is the value of resistive element comprising resistor 115 and switch 140 so that the amplifier gain is inversely proportional to the effective resistance of series connected resistor 115 and switch 140.

The gain control arrangement in FIG. 1 includes level detector 125, waveform generator 130, comparator 135 and switch 140. Level detector 125 receives the amplified signal from the output of low pass filter 120 and forms a signal representative of the amplifier output level in a manner well known in the art. Waveform generator 130 produces a repetitive waveform such as a sawtooth at a rate greater than twice $1/f_u$. The repetitive waveform and the output level representative signal are combined through capacitor 133 and resistor 139 and the resulting signal is applied to input 137 of comparator 135. A fixed reference voltage $V_{ref}$ is applied to the other input of comparator 135. The output of the comparator is in a first state responsive to the reference voltage being greater than the waveform modulated level signal on terminal 137 and in a second state responsive to the reference voltage being less than the signal on terminal 137. When the voltage at terminal 137 is below reference voltage $V_{ref}$, the comparator output puts switch 140 in its closed position. Otherwise, switch 140 is in its open position. If the waveform modulated level signal at terminal 137 is greater than $V_{ref}$, output of the comparator 135 opens switch 140 to provide an effective resistance much higher than the value of resistor 115 between amplifier input terminal 107 and ground. If, however, the voltage on terminal 137 is less than $V_{ref}$, the effective resistance is equal to that of resistor 115. Consequently, the resistance value between amplifier input terminal 107 and ground is dependent on the excursions of the waveform about the level representative signal. Since the opening and closing of switch 140 occurs at a rate greater than twice frequency $f_u$, the transients caused by switch 140 are removed from the amplifier output in low pass filter 120. As a result, the output signal from the low pass filter is free of switching transients.

The opening and closing of switch 140 is dependent on the waveform modified level representative signal at terminal 137 over the range when the waveform deviations intercept the reference voltage $V_{ref}$. In each complete waveform cycle when the waveform deviations intercept the reference voltage, resistor 115 is switched in and out and the effective resistance between amplifier terminal 107 and ground over the waveform interval is the average of the connected and disconnected values in the frequency range of the amplifier. Where the waveform modulated level representative signal in relation to reference voltage $V_{ref}$ is such that resistor 115 is disconnected from ground during half of the waveform cycle and is connected to ground during the other half of the waveform cycle, the effective resistance is one half the sum of the open switch value and the closed switch value. At other level representative signal values, the effective resistance between amplifier terminal 107 and ground is a function of the portion of the coupled waveform above reference voltage $V_{ref}$.

Figure 7:
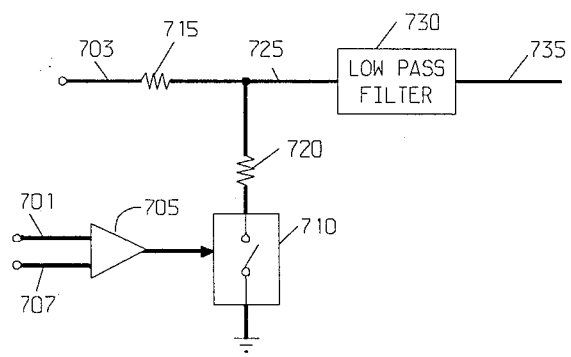
FIG. 7 shows a simplified block diagram of a a resistor divider arrangement having a switched resistive element explanatory of the circuit of FIG. 1.
Figure 8:
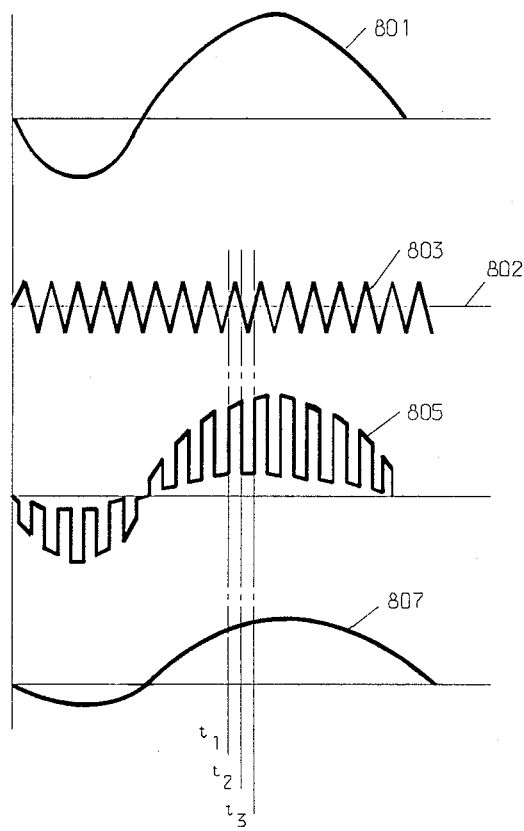
FIG. 8 shows waveforms illustrating the operation of the resistor divider arrangement of FIG. 7.

FIGS. 7 and 8 show the effect of the switched resistive element in a resistance network to illustrate its operation in FIG. 1. In FIG. 7, an input signal illustrated in waveform 801 of FIG. 8 is applied to lead 703 of the resistive divider comprising resistor 715, resistor 720 and switch 710. When switch 710 is closed the voltage at output lead 725 is relatively low compared to the voltage when switch 710 is open. Comparator 705 receives a reference threshold signal on lead 707 and a repetitive sawtooth waveform signal on lead 701. The sawtooth waveform is illustrated in waveform 803. Comparator 705 closes switch 710 when the voltage of the sawtooth waveform is below that of the reference signal and opens the switch when the sawtooth waveform is above the reference signal. Consequently, the voltage on lead 725 switches between high and low values. The impedance switching is illustrated in the sawtooth cycle between $t_1$ and $t_3$ in FIG. 8. In the interval between $t_1$ and $t_2$, sawtooth 803 is above reference threshold 802. Switch 710 in FIG. 7 is open so that there is little attenuation through the resistive divider including resistors 715 and 720. Between times $t_2$ and $t_3$, waveform 803 is below waveform 802. The attenuation is high and the voltage at output lead 725 is relatively low.

The repetition rate of the sawtooth waveform is substantially higher than that of the input signal on lead 703, the output voltage switches many times during each cycle of the input signal of waveform 801 as shown in waveform 805. The signal on lead 725 is passed through low pass filter 730 having a cutoff frequency above the frequency of the input signal on waveform 801 but substantially below the frequency corresponding to the repetition rate of waveform 803. As a result, filter 730 removes the switching transients of waveform 805 and provides a signal on lead 735 (waveform 807) that corresponds to the average of the higher and lower voltage portions of waveform 805. Where as in FIG. 8 the sawtooth of waveform 803 is above the reference threshold during one half of each cycle, the effective resistance of the series combination of resistor 720 and switch 710 is one half the sum of the value of the series combination with switch 710 and the value of resistor 720. In the event the sawtooth is above the reference for more than one half of each cycle, the effective resistance is increased. When the sawtooth is above the reference for less than one half of its cycle, the effective resistance is decreased. The variation of effective resistance is therefore a function of the shape of waveform 803 and the level on which it is superimposed.

Figure 2:
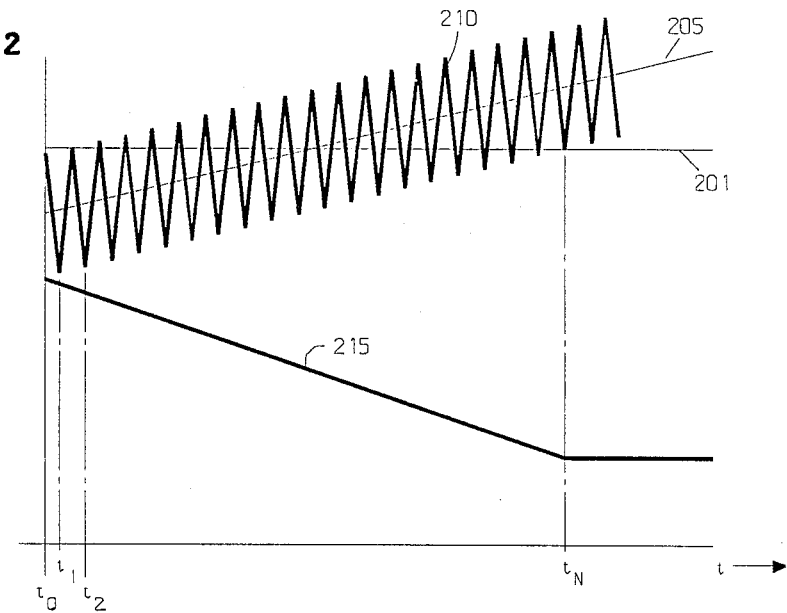
FIG. 2 shows waveforms illustrating the operation of the circuit of FIG. 1.

FIG. 2 shows waveforms illustrating the operation of the gain control arrangement of FIG. 1. Waveform 201 corresponds to reference voltage $V_{ref}$ and waveform 205 is the level representative signal during a period when input signal s(t) is increasing from a low value at time $t_O$ to a high value at time $t_N$ as shown. Waveform 210 is the output of waveform generator 130 after it is coupled through capacitor 133. A sawtooth waveform is shown but it is to be understood that other waveforms may be used. The repetition frequency of sawtooth wave 210 is much higher than the cutoff frequency of low pass filter 120 so that the high frequency switching effects do not appear at the filter output. Waveform 215 corresponds to the gain of the amplifier which is high at low input signal levels and is reduced as a function of the gain control arrangement as the input signal level increases to provide automatic gain control.

In the sawtooth cycle between times $t_1$ and $t_2$, the level representative signal of waveform 205 is below the reference voltage of waveform 201 and only the most positive portion of the sawtooth of waveform 215 exceeds the reference voltage. Consequently, the effective resistance between input terminal 107 and ground increases by a small amount whereby the gain is reduced by a small amount as indicated in waveform 215. The level representative signal of waveform 205 increases smoothly responsive to an increasing input signal in FIG. 2. Each succeeding cycle of the sawtooth waveform has a larger portion above the reference voltage of waveform 201. As a result, the effective resistance increases in each successive waveform interval and the amplifier gain becomes smaller as indicated in waveform 215. The gain of the amplifier decreases in each successive sawtooth cycle from time $t_O$ to time $t_N$. After $t_N$, the sawtooth modulated level signal is always greater than the reference voltage so that comparator 135 keeps switch 140 open and the effective resistance remains at its maximum value. As shown in FIG. 2, the gain curve 215 remains constant after time $t_N$. In accordance with the invention, the effective resistance of a switched resistive element in the feedback path of the amplifier is controlled by a repeated waveform having a repetition frequency higher than twice the highest frequency of the signal being amplified. The repeated waveform modifies a signal representative of the output level of the amplifier. The effective resistance and consequently the gain of the amplifier is a function of the waveform modified level signal. Different waveforms, e.g., sawtooth, exponential etc, may be used to provide different automatic gain control curves.

Figure 3:
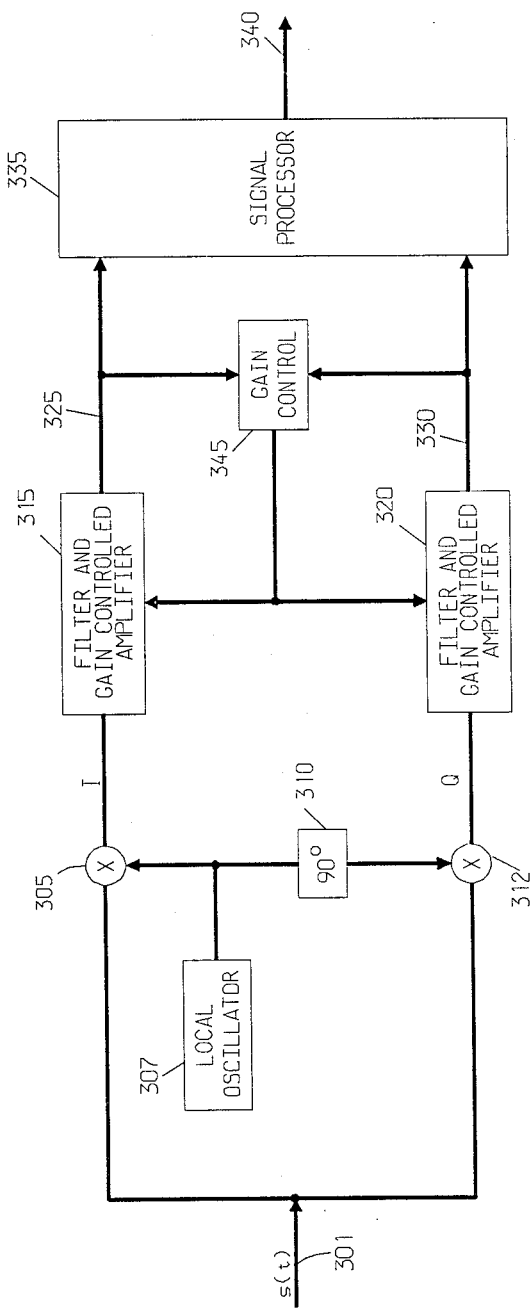
FIG. 3 shows a block diagram of a receiver circuit having a pair of filter and amplifier circuits requiring coordinated gain control over a wide dynamic range in which the invention is useful.

FIG. 3 shows an amplifier arrangement that employs a gain control circuit illustrative of the invention. In FIG. 3, an input signal s(t) obtained from a quadrature phase shift keyed (QPSK) or other modulation system that includes an in-phase and a quadrature phase component. The in-phase I(t) and quadrature phase Q(t) components are separated in mixer circuits 305 and 312 through the use of local oscillator 307 and 90 degree phase shifter 310 as is well known in the art. Signal I(t) is amplified in filter and gain controlled amplifier 315 while signal Q(t) is amplified in filter and gain controlled amplifier 320. Signals I(t) and Q(t) generally have wide dynamic ranges. Automatic gain control circuit 345 receives the output signals of amplifiers 315 and 320 and establishes the gain in each amplifier. Such gain control is required so that signal processor 335 can extract the information contained in the signals from the amplifiers. It is apparent that amplifiers 315 and 320 must accurately track over the dynamic range of the input signals for proper operation of the signal processor.

Figure 4:
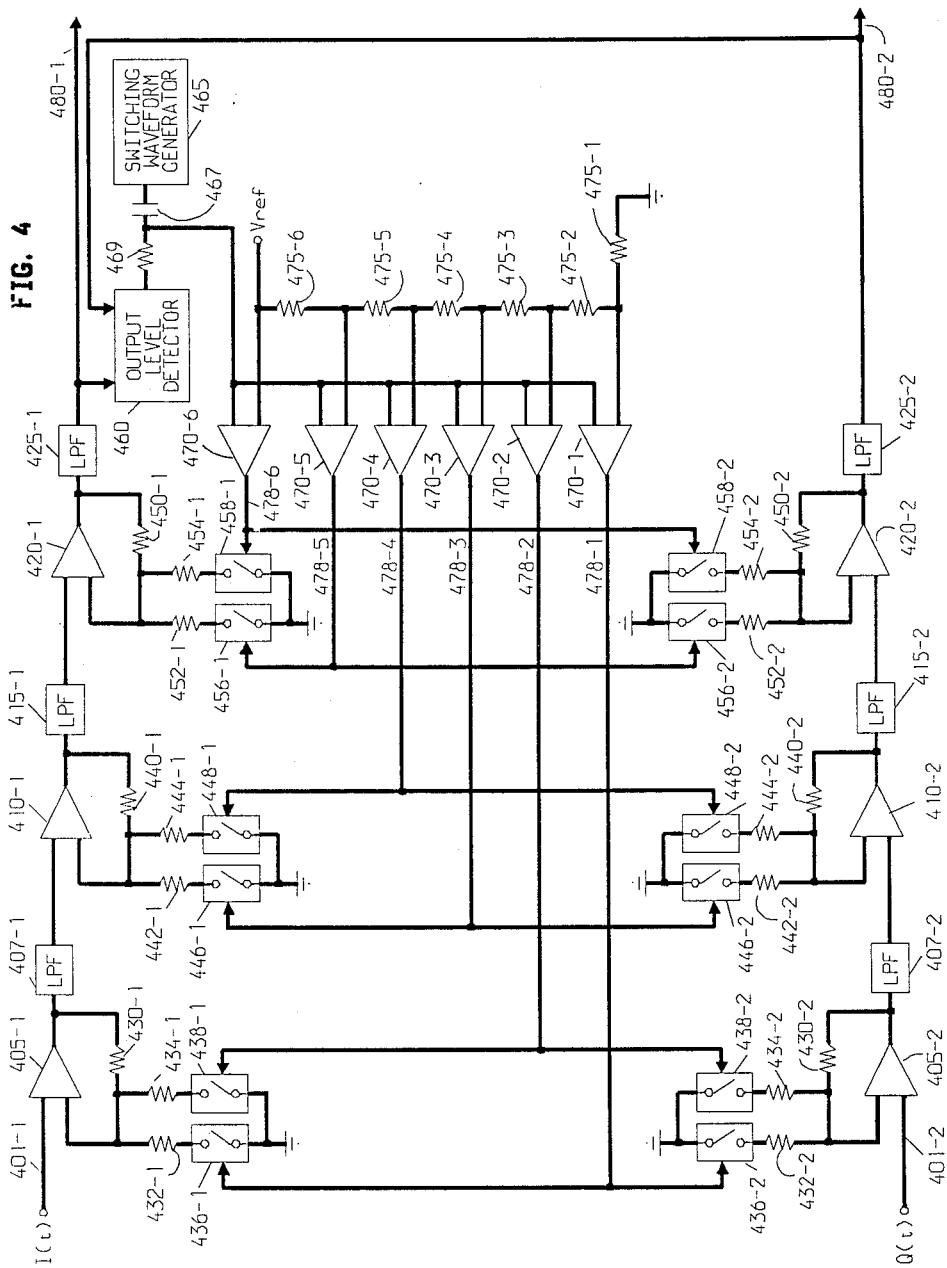
FIG. 4 depicts a more detailed block diagram of the amplifiers and gain control arrangement of FIG. 3 that is illustrative of the invention.
Figure 5:
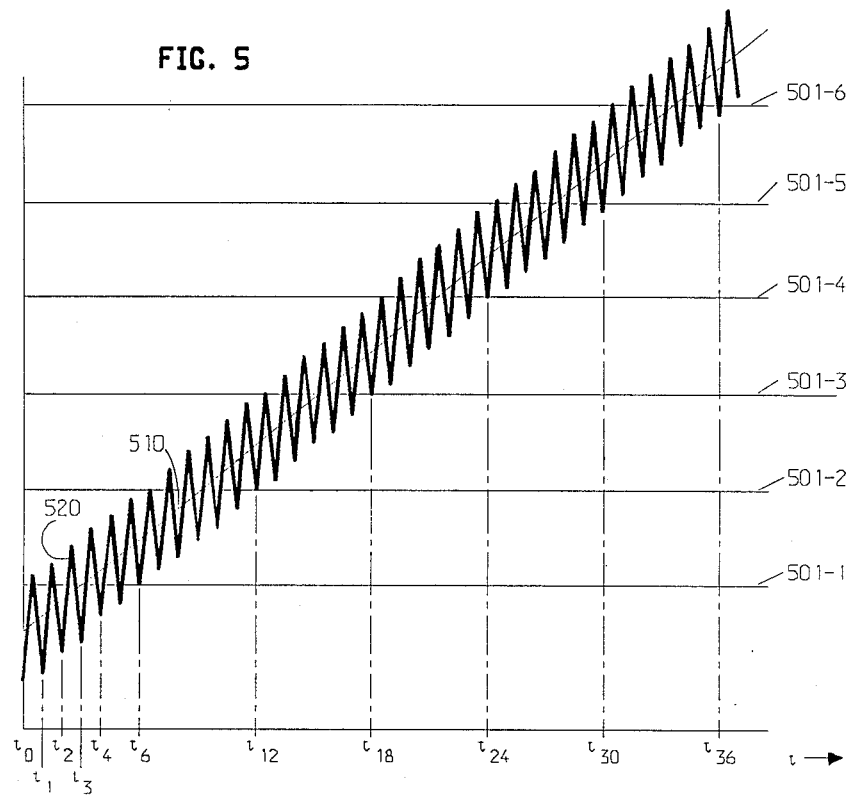
FIGS. 5 and 6 show waveforms illustrating the operation of the circuit of FIG. 4.

FIG. 4 shows amplifiers 315, 320 and automatic gain control circuit 345 of FIG. 3 in greater detail and FIG. 5 shows waveforms illustrating the operation of the arrangement of FIG. 4. Referring to FIG. 4, amplifier 315 includes a first amplifier-filter chain comprising operational type amplifier stages 405-1, 410-1, and 420-1. Low pass filter 407-1 is connected between amplifier 405-1 and 410-1. Low pass filter 415-1 is connected between amplifiers 410-1 and 420-1 and low pass filter 425-1 is connected between amplifier 420-1 and output 480-1. Similarly, amplifier 320 includes a second amplifier-filter chain comprising operational type amplifier stages 405-2, 410-2, and 420-2. Low pass filter 407-2 is connected between amplifiers 405-2 and 410-2. Low pass filter 415-2 is connected between amplifiers 410-2 and 420-2 and low pass filter 425-2 is connected between amplifier 420-2 and output 480-2.

The gain of each amplifier stage is determined by the feedback path including a resistor connected between the amplifier output and one input thereof and a resistive network connected between the one input and ground. The feedback path of amplifier stage 405-1, for example, includes resistor 430-1 between the amplifier stage output and one input thereof and the resistive network connected between that amplifier stage input and ground. The resistive network includes series connected resistor 432-1 and switch 436-1 and series connected resistor 434-1 and switch 438-1. The other amplifier stages shown in FIG. 4 have similar feedback paths operative to control stage gain. While switched impedance elements are shown between each amplifier input and a reference potential, it is to be understood that switched impedance elements may be placed between the amplifier output and the amplifier input or elsewhere to obtain gain control.

The automatic gain control arrangement in FIG. 4 includes output level detector 460, waveform generator 465 and comparators 470-1 through 470-6. Level detector 460 receives the output of low pass filter 425-1 from the first amplifier stage chain and the output of low pass filter 425-2 from the second amplifier stage chain. The level detector is adapted to form a signal representative of the output level of the higher of the signals on leads 480-1 and 480-2 in a manner well known in the art. Waveform generator 465 produces a repetitive sawtooth waveform at a rate higher than the reciprocal of twice the highest frequency of interest in the first and second amplifier chains. The sawtooth waveform is combined with the output of level detector 460 through capacitor 467 and resistor 469. The combined output of level detector 460 and waveform generator 465 is shown in waveforms 510 and 520. Waveform 510 corresponds to the level representative signal which is shown as increasing linearly responsive to an increasing input signals on leads 401-1 and 401-2. Waveform 520 corresponds to the sawtooth variations on the level representative signal resulting in the excursions shown in FIG. 5.

The waveform modulated signal at the junction of capacitor 467 and resistor 469 is applied to one input of each of comparators 470-1 through 470-6. The other input of each comparator receives a predetermined portion of reference voltage $V_{ref}$ through the resistor divider network including series connected resistors 475-1 through 475-6. The voltage on the reference input of comparator 470-1 is shown in waveform 501-1 in FIG. 5. The voltages on the reference inputs of comparators 470-2 through 470-6 are shown as waveforms 501-2 through 501-6, respectively. As indicated in FIG. 5, the reference voltages for comparators 470-1 through 470-6 are regularly spaced over a predetermined voltage range. The lowest reference voltage is applied to comparator 470-1 while the highest reference voltage $V_{ref}$ is applied to comparator 470-6. The spacing between successive reference voltages corresponds to twice the amplitude of the waveform so that the comparators are successively activated.

Each comparator is in a first state when the waveform modulated level signal is less than the comparator reference voltage and in a second state when the waveform modulated level signal is greater than the comparator reference voltage. The output of each comparator controls a pair of resistive element switches. For example, the output of comparator 470-1 controls the operation of switch 436-1 in amplifier stage 405-1 and switch 436-2 in amplifier stage 405-2 via lead 478-1 and output of comparator 470-6 controls the operation of switch 458-1 in amplifier stage 420-1 and switch 458-2 in amplifier stage 420-2 via lead 478-6. Responsive to a comparator being in its first state the connected switches are open and responsive to that comparator being in its second state, the connected switches are closed. Thus, the effective resistances in corresponding amplifier stages of the first and second amplifier chains are matched whereby the gains of the two amplifier chains track.

Figure 6:
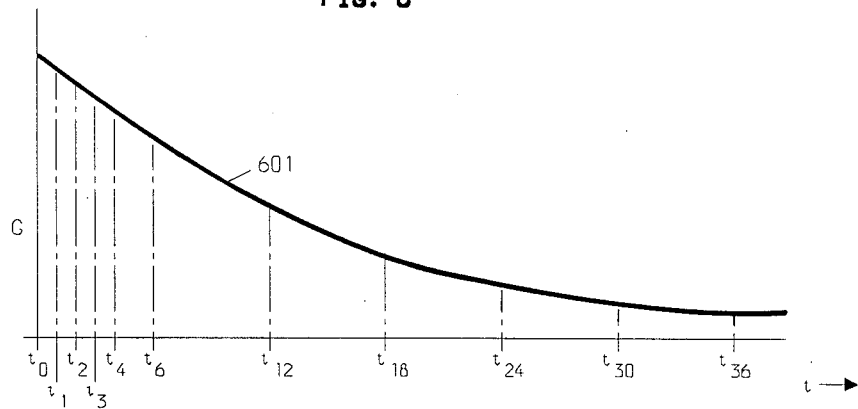

FIG. 6 shows gain curve 601 as a function of time for the gain controlled amplifier circuit of FIG. 4 with the increasing input signal as in FIG. 5. Referring to FIGS. 5 and 6, level representative signal of waveform 510 is shown as increasing from $t_0$ to $t_{36}$. The magnitude of the combined sawtooth waveform (waveform 520) and level representative signal (waveform 510) is set to be slightly greater than the spacing between adjacent comparator reference voltages. In the first sawtooth interval between times $t_0$ and $t_1$, the sawtooth excursion about the level representative signal reaches the reference voltage level of comparator 470-1 at its most positive point. As a result, switches 436-1 and 436-2 controlled by comparator 470-1 are opened for a very short portion of the interval and the effective resistances correspond to the values of resistors 432-1 and 432-2. All other switches remain closed in this interval so that the gain is high as shown in waveform 601. In the next interval between times $t_1$ and $t_2$, a greater portion of the sawtooth exceeds the reference voltage of comparator 470-1 and the effective resistances of series connected resistor 432-1 and switch 436-1 and series connected resistor 432-2 and switch 436-2 increase so that the gains of the first and second amplifiers become smaller by the same amount. In the interval between times $t_3$ and $t_4$, the effective resistance of series connected resistor 432-1 and switch 436-1 and series connected resistor 432-2 and switch 436-2 are reduced to one half the sum of the value with switches 436-1 and 436-2 open and the values of resistors 432-1 and 432-2 since the switches are opened for one half the interval. After time $t_6$, these switches remain open and the effective resistances are high.

Between time $t_6$ and $t_{12}$ switches 436-1 and 436-2 are open, switches 438-1 and 438-2 cycle between their closed and open positions responsive to the sawtooth voltage passing through the reference voltage applied to comparator 470-2 and the remaining switches are closed. The effective resistances for switched resistors 434-1 and 434-2 increase during the interval. Switches 436-1, 436-2, 438-1 and 438-2 are open after time $t_{12}$ and between times $t_{12}$ and $t_{18}$ the effective resistances of the gain determining elements comprising resistors 442-1 and 442-2 increase in value as the sawtooth waveform passes through the reference voltage applied to comparator 470-3. Between times $t_{18}$ and $t_{24}$ switches 436-1, 436-2, 438-1,438-2, 446-1 and 446-2 are open and the effective resistances of the gain determining elements comprising resistors 444-1 and 444-2 increase as the sawtooth waveform passes through the reference voltage applied to comparator 470-4.

Switches 436-1, 436-2, 438-1, 438-2, 446-1, 446-2, 448-1 and 448-2 are open after time $t_{24}$ since the sawtooth voltage is above the reference voltages for comparators 470-1, 470-2, 470-3 and 470-4. The effective resistances of switched resistors 452-1 and 452-2 increase as the sawtooth voltage increases from $t_{24}$ to $t_{30}$ while switches 436-1 through 448-2 remain open. From $t_{30}$ through $t_{36}$ the effective resistances of switched resistors 454-1 and 454-2 increase responsive to the operation of comparator 470-6 and switches 458-1 and 458-2 while switches 436-1 through 456-2 are opened. As the waveform modulated level signal increases above reference waveform 501-6, all switches are open and the gains of the first and second amplifier chains remain fixed at its lower end.

It is evident from the waveforms of FIG. 5, that the resistance changes in the circuit of FIG. 4 are relatively smooth since the sawtooth wave increases at a slow rate through the successive reference voltage levels 501-1 through 501-6 compared to the repetition rate of waveform genertor 465. Consequently, gain changes are smooth as shown in gain curve 601 of FIG. 6. As aforementioned with respect to FIG. 2, low pass filters 407-1, 407-2, 415-1 and 415-2, and 425-1 and 425-2 have cutoff frequencies that are less than half the repetition frequency of sawtooth generator 465 so that switching transients occurring in the amplifier stages are removed and do not appear at outputs 480-1 and 480-2.

Figure 9:
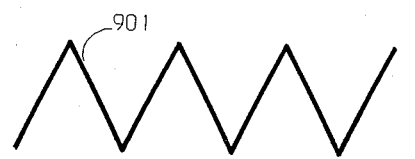
FIG. 9 illustrates types of repetitive waveforms that may be used in the circuits of FIGS. 1 and 3.
Figure 9:

FIG. 9 shows various waveforms that may be generated in switching waveform generator 465. Waveform 901 is a sawtooth wave having a linearly increasing portion followed by a linearly decreasing portion. This waveform results in a gain control curve that is a straight line approximation to a logarithmic gain curve as shown in FIG. 6. An exponential waveform having a sharp front edge and an exponentially decaying back edge such as shown in waveform 903 may also be used. The exponential curve of waveform 903 results in changes in the value of the switched resistance that are dependent on the decay time of the exponential so that a gain control function that is smoother than a straight line approximation may be obtained. It is to be understood that other types of repetitive waveforms may be used to provide gain curves having other properties and that more switched resistive elements may be added to modify the features of the gain curves. If, for example, the resistor values are chosen to produce equal db gain changes, the AGC control voltage is a log function of the input signal.

The invention has been described with reference to illustrative embodiments thereof. It is apparent, however, to one skilled in the art that various modifications and changes may be made without departing from the spirit and scope of the invention.

I claim:

1. A circuit for controlling the gain of an amplifier operating over a prescribed frequency range having an input and an output comprising:
   means coupled to the output of the amplifier for generating a first signal representative of the output level of the amplifier,
   means for generating a second signal having predetermined waveform repeated at a rate greater than the reciprocal of twice the upper frequency of the prescribed frequency range;
   means connected to the first and second signal generating means for forming a third signal having a level corresponding to the first signal and variations therefrom corresponding to the second signal;
   means for generating a reference threshold; and
   means connected to the amplifier responsive to the third signal and the reference threshold for determining the gain of the amplifier including
   at least one switched impedance element; and
   means jointly responsive to the third signal and said reference threshold for altering the value of the switched impedance element at the repetition rate of the second signal.

2. A circuit for controlling the gain of an amplifier operating over a prescribed frequency range having an input and an output according to claim 1 wherein
   the amplifier includes a feedback path connected between the amplifier output and the amplifier input;
   the switched impedance element being coupled to the feedback path of the amplifier.

3. A circuit for controlling the gain of an amplifier operating over a prescribed frequency range having an input and an output according to claim 2 wherein the switched impedance element comprises:
   a resistance network; and switching means responsive to the third signal for varying the value of the resistance network at the repetition rate of the second signal.

4. A circuit for controlling the gain of an amplifier operating over a prescribed frequency range having an input and an output according to claim 3 further comprising means connected between the amplifier output and the first signal generating means for limiting the frequency range of the amplifier output whereby transients in the amplifier output resulting from the operation of the switching means are removed.

5. A circuit for controlling the gain of an amplifier operating over a prescribed frequency range having an input and an output according to claim 4 wherein the means for forming the third signal comprises means for a.c. coupling the output of the second signal generating means to the output of the first signal generating means.

6. A circuit for controlling the gain of an amplifier operating over a prescribed frequency range having an input and an output according to claim 2 wherein the amplifier feedback path comprises a first resistive element connected between the amplifier output and the amplifier input; and a switched impedance element connected between the amplifier input and a reference potential.

7. A circuit for controlling the gain of an amplifier operating over a prescribed frequency range having an input and an output according to claim 1 wherein the second signal generating means comprises means for producing a repeated sawtooth waveform at a rate greater than the reciprocal of twice the upper frequency of the prescribed frequency range.

8. A circuit for controlling the gain of an amplifier operating over a prescribed frequency range having an input and an output according to claim 1 wherein the second signal generating means comprises means for producing a repeated exponential waveform at a rate greater than the reciprocal of twice the upper frequency of the prescribed frequency range.

9. A circuit for controlling the gain of an amplifier operating over a prescribed frequency range having an input and an output according to claim 1 wherein the amplifier further comprises means for limiting frequency range of the amplifier output to the prescribed frequency range whereby transients in the amplifier output resulting from the operation of the switching means are removed.

10. In a system having a plurality of amplifiers operating over a prescribed frequency range each having an input and an output, a common circuit for controlling the gains of the amplifiers comprising:
means coupled to the output of each amplifier for generating a signal representative of the output level of the amplifier;
means responsive to the level representative signals of the amplifiers for producing a combined amplifier level signal;
means for generating a signal having a repeated predetermined waveform occurring at a rate greater than the reciprocal of twice the upper frequency of the prescribed frequency range;
means connected to the output of the combined level signal producing means and the predetermined waveform signal generating means for forming a first signal having a level corresponding to the combined level signal and varying therefrom in accordance with the predetermined waveform signal;
means for generating at least one reference threshold signal; and
means responsive to the first signal and the reference threshold signals for determining the gains of the plurality of amplifiers including
at least one switched impedance element in each amplifier; and
means jointly responsive to the first signal and said reference threshold signals for altering the value of the switched impedance elements in each amplifier at the repetition rate of the predetermined waveform signal.

11. In a system having a plurality of amplifiers each having an input and an output, a common circuit for controlling the gains of the amplifiers according to claim 10 wherein
each amplifier includes a feedback path connected between the amplifier output and the amplifier input;
each amplifier switched impedance element being coupled to the amplifier feedback path.

12. In a system having a plurality of amplifiers each having an input and an output, a common circuit for controlling the gains of the amplifiers according to claim 11 wherein the switched impedance element of each amplifier comprises:
a resistance network; and
switching means responsive to the first signal for varying the value of the resistance network at the repetition rate of the predetermined waveform signal.

13. In a system having a plurality of amplifiers each having an input and an output, a common circuit for controlling the gains of the amplifiers according to claim 12 further comprising means connected between each amplifier output and the level signal generating means for limiting the frequency range of the amplifier output whereby transients in the amplifier output resulting from the operation of the amplifier switching means are removed.

14. In a system having a plurality of amplifiers each having an input and an output, a common circuit for controlling the gains of the amplifiers according to claim 13 wherein the means for forming the first signal comprises means for a.c. coupling the output of the predetermined waveform signal generating means to the output of the means for producing a combined amplifier level signal.

15. In a system having a plurality of amplifiers each having an input and an output, a common circuit for controlling the gains of the amplifiers according to claim 10 wherein the predetermined waveform generating means comprises means for producing a repeated sawtooth waveform at a rate greater than the reciprocal of twice the upper frequency of the prescribed frequency range.

16. In a system having a plurality of amplifiers each having an input and an output, a common circuit for controlling the gains of the amplifiers according to claim 10 wherein the predetermined waveform generating means comprises means for producing a repeated exponential waveform at a rate greater than the reciprocal of twice the upper frequency of the prescribed frequency range.

17. In a system having a plurality of amplifiers each having an input and an output, a common circuit for controlling the gains of the amplifiers according to claim 10 wherein each amplifier further comprises means for limiting frequency range of the amplifier output to the prescribed frequency range.

18. In a system having a plurality of amplifiers each having an input and an output, a common circuit for controlling the gains of the amplifiers according to claim 10 wherein
the reference threshold signal generating means comprises a plurality of different reference threshold signals;
the at least one switched impedance element in each amplifier comprises a plurality of switched impedance elements each corresponding to one of the plurality of reference voltage signals;
the means for altering the value of the switched impedance element in each amplifier comprises
a plurality of comparing means each comprising means for comparing the first signal to a different reference threshold signal, each comparing means being placed in a first state responsive to the first signal being less than the reference threshold signal and in a second state responsive to the first signal being greater than the reference threshold signal;
means responsive to the state of each comparing means for determining the value of the switched impedance element in each amplifier corresponding to the reference threshold signal applied to the comparing means.

19. In a system having a plurality of amplifiers each having an input and an output, a common circuit for controlling the gains of the amplifiers according to claim 18 wherein the plurality of reference voltage signals are uniformly spaced and the repeated predetermined waveform amplitude is substantially the spacing between adjacent reference voltage signals.

20. A signal amplifying circuit comprising:
a plurality of amplifier stages connected in tandem, each amplifier stage including an amplifier operating over a prescribed frequency range having an input and an output and filtering means for limiting the amplifier output to the prescribed frequency range;
means coupled to an output of the signal amplifying circuit for generating a signal representative of the output level of the signal amplifying circuit;
means for generating a signal having a predetermined waveform repeated at a rate greater than the reciprocal of twice the upper frequency of the prescribed frequency range;
means connected to the outputs of the level representative signal generating means and the predetermined waveform generating means for forming a first signal having a level corresponding to the level representative signal and varying therefrom according to the predetermined waveform signal;
means for generating at least one reference threshold signal; and
means responsive to the first signal and the reference threshold signals for determining the gain of each amplifier stage including
at least one switched impedance element in each amplifier stage; and
means jointly responsive to the first signal and said at least one reference threshold signal for altering the value of the switched impedance elements in each amplifier stage at the repetition rate of the predetermined waveform signal.

21. A signal amplifying circuit according to claim 20 wherein each amplifier includes
a feedback path connected between the amplifier output and the amplifier input;
each amplifier switched impedance element being coupled to the amplifier feedback path.

22. A signal amplifying circuit according to claim 21 wherein the switched impedance element of each amplifier comprises:
a resistance network; and
switching means responsive to the first signal and the reference threshold signals for varying the value of the resistance network at the repetition rate of the predetermined waveform signal.

23. A signal amplifying circuit according to claim 22 wherein the means for forming the first signal comprises means for a.c. coupling the output of the predetermined waveform signal generating means to the output of the level representative generating means.

24. A signal amplifying circuit according to claim 23 wherein the predetermined waveform generating means comprises means for producing a sawtooth waveform repeated at a rate greater than the reciprocal of twice the upper frequency of the prescribed frequency range.

25. A signal amplifying circuit according to claim 23 wherein the predetermined waveform generating means comprises means for producing a exponential waveform repeated at a rate greater than the reciprocal of twice the upper frequency of the prescribed frequency range.

26. A signal amplifying circuit according to claim 20 wherein
the reference threshold signal generating means comprises means for generating a reference threshold signal for each amplifier stage; and
the means for altering the value of the switched impedance element in each amplifier stage at the repetition rate of the predetermined waveform signal comprises
means responsive to the first signal and a selected one of the reference threshold signals for comparing the first signal to the reference threshold signal, said comparing means generating a first state signal when the first signal is less than the selected reference threshold signal and generating a second state signal when the first signal is greater then the selected threshold signal; and
means connected between the comparing means and the switched impedance element of the amplifier stage responsive to the first state signal for placing the switched impedance element at one predetermined value and responsive to the second state signal to place the switched impedance value at another predetermined value.

27. A signal amplifying circuit according to claim 20 wherein
the means for generating at least one reference voltage comprises means for generating a series of uniformly spaced reference voltages; and
the amplitude of each repeated predetermined waveform is substantially equal to the spacing between adjacent reference voltage signals.

* * * * *